(12) United States Patent
Choi

(10) Patent No.: US 8,369,696 B2
(45) Date of Patent: Feb. 5, 2013

(54) MICRO-HEATERS, METHODS FOR MANUFACTURING THE SAME, AND METHODS FOR FORMING PATTERNS USING THE MICRO-HEATERS

(75) Inventor: Junhee Choi, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 826 days.

(21) Appl. No.: 12/289,439

(22) Filed: Oct. 28, 2008

(65) Prior Publication Data

US 2009/0304371 A1    Dec. 10, 2009

(30) Foreign Application Priority Data

Jun. 10, 2008  (KR) .................. 10-2008-0053974

(51) Int. Cl.
*F26B 19/00* (2006.01)
(52) U.S. Cl. .......................... 392/418; 338/51
(58) Field of Classification Search .................. None
See application file for complete search history.

(56) References Cited

U.S. PATENT DOCUMENTS

| | | | | |
|---|---|---|---|---|
| 3,745,508 A * | 7/1973 | Bruder et al. | ................. | 338/320 |
| 4,374,312 A | 2/1983 | Damron | | |
| 4,478,077 A | 10/1984 | Bohrer et al. | | |
| 4,510,036 A * | 4/1985 | Takeuchi et al. | ............... | 204/425 |
| 4,651,564 A | 3/1987 | Johnson et al. | | |
| 4,696,188 A * | 9/1987 | Higashi | ...................... | 73/204.19 |
| 5,288,973 A * | 2/1994 | Ota et al. | ....................... | 219/216 |
| 5,780,524 A * | 7/1998 | Olsen | ................................ | 522/2 |
| 6,091,050 A * | 7/2000 | Carr | ............................... | 219/201 |
| 6,331,074 B1 | 12/2001 | Kimura | | |
| 6,460,966 B1 * | 10/2002 | Hellekson et al. | ............... | 347/20 |
| 6,705,152 B2 * | 3/2004 | Routkevitch et al. | ........ | 73/31.05 |
| 6,896,780 B2 * | 5/2005 | Yang et al. | ..................... | 204/408 |
| 7,049,556 B2 * | 5/2006 | Aoki et al. | ..................... | 219/543 |

(Continued)

FOREIGN PATENT DOCUMENTS

| JP | 07-022315 | 1/1995 |
|---|---|---|
| JP | 2002-124466 | 4/2002 |

(Continued)

OTHER PUBLICATIONS

US Office Action dated Mar. 5, 2012 issued in co-pending U.S. Appl. No. 12/149,884.

(Continued)

*Primary Examiner* — Thor Campbell
(74) *Attorney, Agent, or Firm* — Harness, Dickey & Pierce, P.L.C.

(57) ABSTRACT

Example embodiments relate to micro-heaters, micro-heater arrays, methods for manufacturing the micro-heater, and methods for forming a pattern using the micro-heater. A micro-heater according to example embodiments may include a metal pattern formed on a substrate. A support may be formed beneath the metal pattern, the support securing the metal pattern to the substrate while spacing the metal pattern apart from the substrate. A spacer may be formed on the substrate and adjacent to the metal pattern, a first distance from the substrate to the top surface of the spacer being greater than a second distance from the substrate to the top surface of the metal pattern. The distance between the micro-heater and a target substrate positioned above the metal pattern may be controlled by the spacer, thus allowing the formation of a relatively fine pattern on the target substrate.

22 Claims, 10 Drawing Sheets

U.S. PATENT DOCUMENTS

| | | | |
|---|---|---|---|
| 7,119,656 B2 * | 10/2006 | Landsberger et al. | 338/195 |
| 7,329,361 B2 | 2/2008 | Guha et al. | |
| 7,525,071 B2 | 4/2009 | Goto et al. | |
| 7,533,564 B2 * | 5/2009 | Pan et al. | 73/204.26 |
| 7,807,483 B2 * | 10/2010 | Yamazaki et al. | 438/29 |
| 7,932,112 B2 * | 4/2011 | Yokoyama et al. | 438/34 |
| 7,999,211 B2 | 8/2011 | Ruiz et al. | |
| 2004/0178879 A1 * | 9/2004 | Mitra et al. | 338/34 |
| 2006/0141135 A1 | 6/2006 | Wang et al. | |
| 2007/0052024 A1 | 3/2007 | Lee et al. | |
| 2009/0139974 A1 | 6/2009 | Choi et al. | |
| 2009/0223557 A1 | 9/2009 | Park et al. | |
| 2009/0250112 A1 | 10/2009 | Choi et al. | |
| 2009/0256169 A1 * | 10/2009 | Yokoyama et al. | 257/98 |
| 2010/0187662 A1 | 7/2010 | Choi et al. | |
| 2010/0193505 A1 | 8/2010 | Peck | |
| 2011/0090184 A1 * | 4/2011 | Yamazaki et al. | 345/204 |
| 2011/0193124 A1 * | 8/2011 | Yokoyama et al. | 257/98 |
| 2012/0132643 A1 | 5/2012 | Choi et al. | |

FOREIGN PATENT DOCUMENTS

| | | |
|---|---|---|
| JP | 2004-087143 | 3/2004 |
| JP | 2004-269968 | 9/2004 |
| JP | 2005-150061 | 6/2005 |
| JP | 2006-047276 | 2/2006 |
| JP | 2006-286372 | 10/2006 |
| JP | 2010-278142 | 12/2010 |
| KR | 10-2002-0090428 | 12/2002 |
| KR | 20-0358225 | 7/2004 |
| KR | 10-2004-0103726 | 9/2004 |
| KR | 10-2006-0062139 | 6/2006 |
| KR | 10-2006-0110201 | 10/2006 |
| KR | 10-2007-0009804 | 1/2007 |
| KR | 10-2009-0066644 | 6/2009 |

OTHER PUBLICATIONS

European Search Report, dated Sep. 16, 2011, for Application 08157114.3-1242/2066147.

S. Dittmer et al., *Low Ambient Temperature CVD Growth of Carbon Nanotubes.*, 243-246 (2006).

Ongi Englander et al., *Local Synthesis of Silicon Nanowires and Carbon Nanotubes on Microbridges.*, 4797-4799, (2003).

US Office Action dated Jul. 16, 2012 issued in co-pending U.S. Appl. No. 12/289,440.

US Office Action dated Aug. 30, 2012 issued in co-pending U.S. Appl. No. 12/149,884.

* cited by examiner

MICRO-HEATERS, METHODS FOR MANUFACTURING THE SAME, AND METHODS FOR FORMING PATTERNS USING THE MICRO-HEATERS

PRIORITY STATEMENT

This application claims priority under 35 U.S.C. §119 to Korean Patent Application No. 10-2008-0053974, filed on Jun. 10, 2008 with the Korean Intellectual Property Office (KIPO), the entire contents of which are incorporated herein by reference.

BACKGROUND

1. Field

Example embodiments relate to micro-heaters, methods for manufacturing micro-heaters, and methods for forming patterns.

2. Discussion of Related Art

Organic electroluminescent (EL) materials are commonly used in active matrix organic light-emitting diodes (AMOLEDs). However, an organic EL material has relatively weak stability. As a result, it is relatively difficult to form a pattern from an organic EL material using a conventional photolithography process.

An evaporation method using a shadow mask is conventionally used to form a pattern from an organic EL material. The evaporation method forms a pattern by evaporating and depositing the organic EL material onto a substrate equipped with a shadow mask. A transfer method using laser (e.g., laser-induced thermal imaging (LITI), laser-induced pattern-wise sublimation (LIPS)) is also conventionally used to form a pattern. The LITI and LIPS methods employ laser scanning to heat a material for subsequent deposition as a desired pattern.

SUMMARY

A micro-heater according to example embodiments may include a metal pattern, a support, and a spacer. The metal pattern may be formed on a substrate. The support may be formed beneath the metal pattern, the support securing the metal pattern to the substrate while spacing the metal pattern apart from the substrate. The spacer may be formed on the substrate and adjacent to the metal pattern, a first distance from the substrate to the top surface of the spacer being greater than a second distance from the substrate to the top surface of the metal pattern. A plurality of micro-heaters may be arranged in parallel to form a micro-heater array according to example embodiments.

A method for manufacturing a micro-heater according to example embodiments may include forming a heating layer on a substrate and patterning the heating layer. An insulating layer may be formed on the substrate, the insulating layer being thicker than the patterned heating layer. The insulating layer and a portion of the substrate may be etched to form a spacer adjacent to the patterned heating layer along with a support positioned between the patterned heating layer and the etched substrate.

A method for forming a pattern using the micro-heater according to example embodiments may include disposing a metal pattern on a substrate and a spacer adjacent to the metal pattern. A transfer material may be formed on the metal pattern. A target substrate may be placed on the spacer and above the metal pattern. Power may be applied to the metal pattern to selectively evaporate and transfer the transfer material from the metal pattern to the target substrate to form the pattern.

BRIEF DESCRIPTION OF THE DRAWINGS

The above and other features of example embodiments may be better appreciated in view of the following detailed description in conjunction with the accompanying drawings, in which.

DETAILED DESCRIPTION OF EXAMPLE EMBODIMENTS

Figure 1:
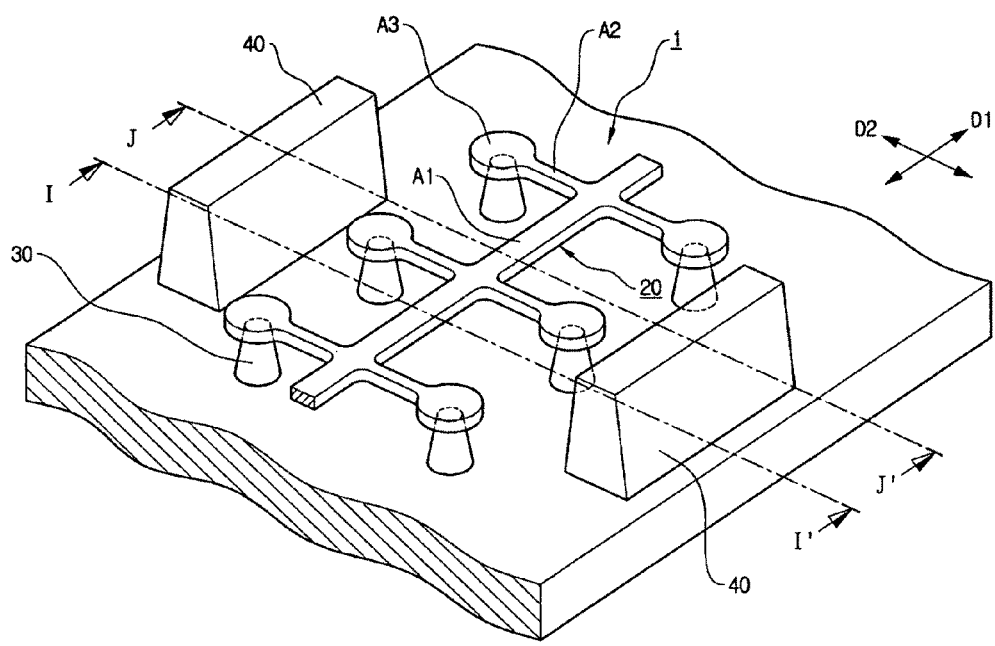
FIG. 1 is a perspective view of a micro-heater according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
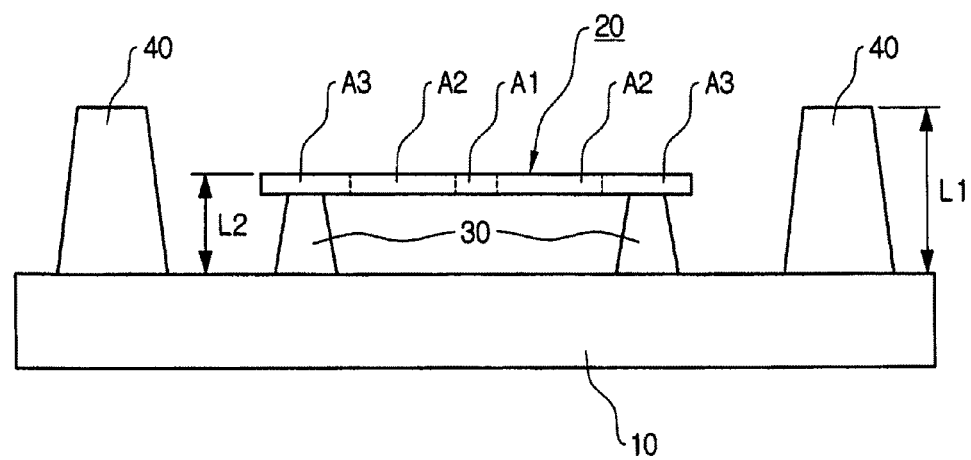
FIG. 2 is a cross-sectional view of the micro-heater of FIG. 1, taken along line I-I'.
Figure 3:
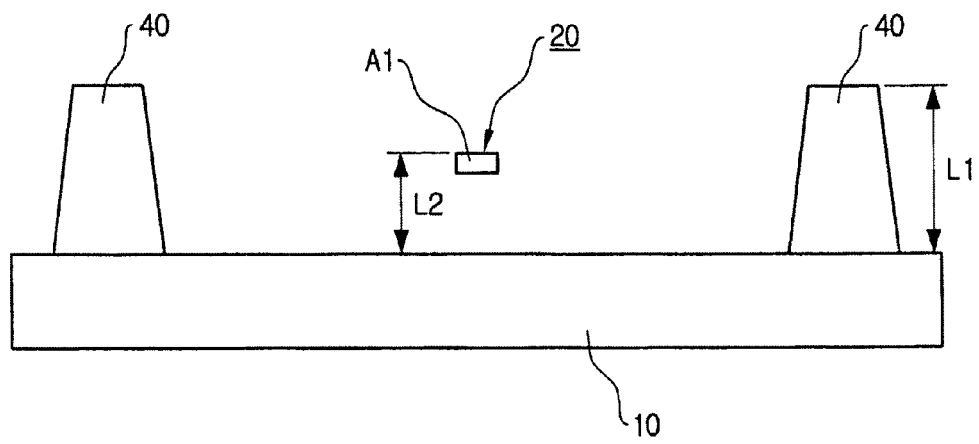
FIG. 3 is a cross-sectional view of the micro-heater of FIG. 1, taken along line J-J'.
Figure 4:
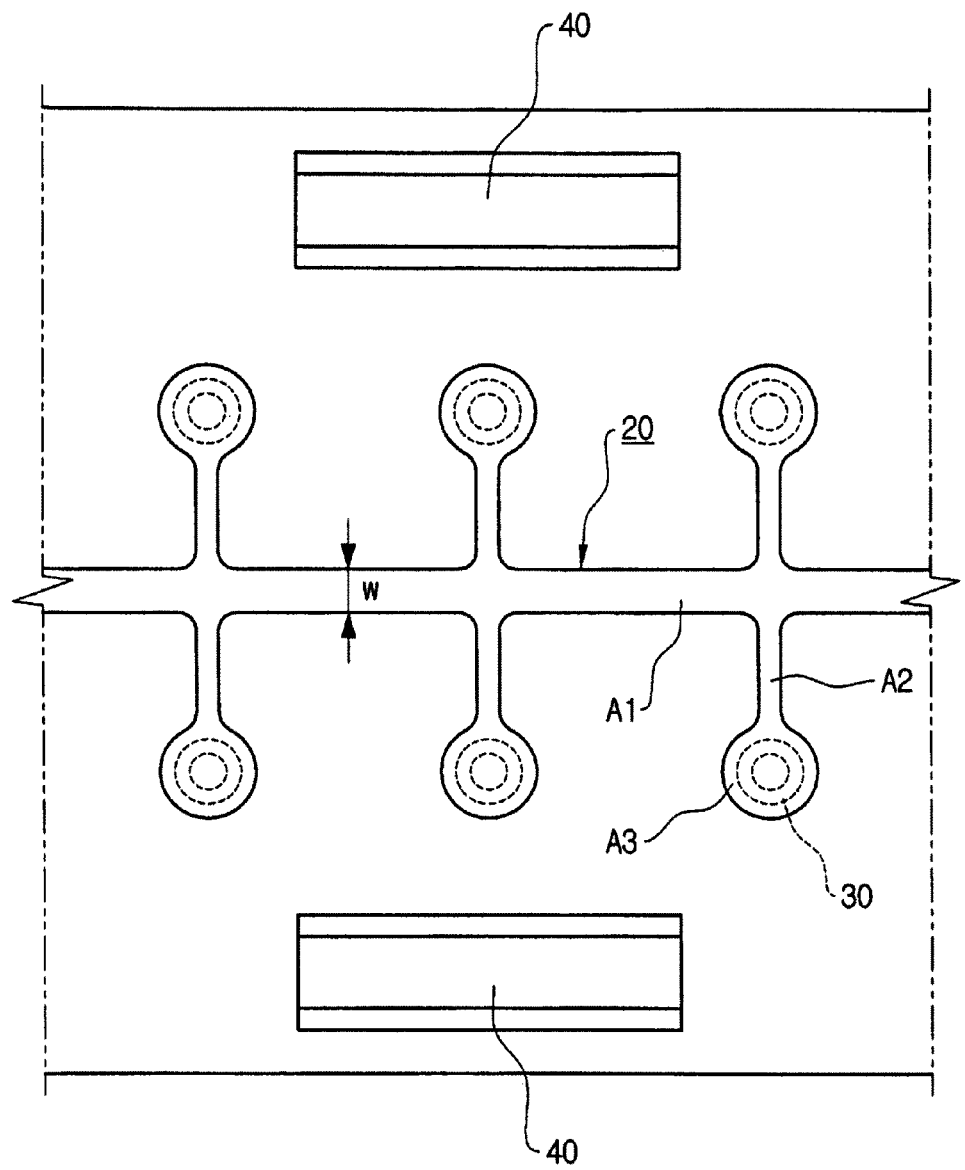
FIG. 4 is a plan view of the micro-heater of FIG. 1.

FIG. 1 is a perspective view of a micro-heater according to example embodiments. FIG. 2 is a cross-sectional view of the micro-heater of FIG. 1, taken along line I-I'. FIG. 3 is a cross-sectional view of the micro-heater of FIG. 1, taken along line J-J'. FIG. 4 is a plan view of the micro-heater of FIG. 1.

Referring to FIGS. 1 to 4, the micro-heater 1 may be provided on a substrate 10. The micro-heater 1 may include a metal pattern 20, supports 30, and spacers 40. The substrate 10 may be formed of a silicon wafer or glass material. For example, when the substrate 10 is formed of a glass material, radiation heat (via visible rays or infrared (IR) rays) may be transmitted through the substrate 10. Therefore, relatively high-temperature heating is possible.

The metal pattern 20 may be secured on the substrate 10 while also being spaced apart from the substrate 10 by the supports 30. The metal pattern 20 may be formed of molybdenum, tungsten, silicon carbide, or other suitable materials. Light and heat may be emitted by applying power to the metal pattern 20.

The metal pattern 20 may include first, second, and third areas A1, A2, and A3, respectively. The first area A1 of the metal pattern 20 may extend in a first direction D1 on the substrate 10. On the other hand, the second areas A2 of the metal pattern 20 may extend in a second direction D2 from both sides of the first area A1. The second direction may be perpendicular to the first direction D1. The third areas A3 of the metal pattern 20 may be enlarged regions at the ends of the second areas A2. The metal pattern 20 may be fixed to the substrate 10 by the supports 30 via the third areas A3.

Although the second areas A2 are illustrated as being provided symmetrically on both sides of the first area A1, it should be understood that the depiction in the drawings are merely provided for illustrative purposes. Thus, other configurations are possible. For example, the second areas A2 may be provided alternately on both sides of the first area A1.

Each of the supports 30 may be provided between the substrate 10 and the third area A3 of the metal pattern 20, thereby allowing the metal pattern 20 to be fixed to the substrate 10. The supports 30 may be formed by wet etching. The support 30 may be formed such that the size of the area in contact with the substrate 10 is greater than the size of the area in contact with the third area A3 of the metal pattern 20.

The third area A3 of the metal pattern 20 and the cross-section of the support 30 in contact with the third area A3 may have a circular shape. However, the third area A3 and the cross-section of the support 30 may have other shapes (e.g., elliptical shape, polygonal shape) depending on etching conditions.

The support 30 may be formed of a material having a relatively low thermal conductivity to reduce or prevent the loss of heat from the metal pattern 20. For example, the support 30 may include one or more of glass and an oxide (e.g., $SiO_x$).

The spacers 40 may be formed on the substrate 10 adjacent to the metal pattern 20. Like the support 30, the spacer 40 may include one or more of glass and an oxide (e.g., $SiO_x$). The spacers 40 may allow another substrate (e.g., target substrate) to be positioned above the substrate 10 while also being spaced apart from the metal pattern 20 by a desired distance.

Referring to FIGS. 2 and 3, the first distance L1 from the substrate 10 to the top surface of the spacer 40 may be greater than the second distance L2 from the substrate 10 to the top surface of the metal pattern 20. As a result, when a second substrate is positioned on the spacers 40 and above the substrate 10, the second substrate is still spaced apart from the metal pattern 20.

The micro-heater configured as described above may be used to form a pattern of a transfer material (e.g., electroluminescent (EL) material). For example, a transfer material may be initially formed on the metal pattern 20. The metal pattern 20 may be heated by applying power to the metal pattern 20. When the metal pattern 20 is heated to a temperature above the melting point of the transfer material, the transfer material is evaporated and transferred onto the target substrate positioned above the metal pattern 20. Therefore, a pattern may be formed on the target substrate above the metal pattern 20.

The transfer material on the metal pattern 20 may be selectively evaporated by adjusting the heating temperature and heating time of the metal pattern 20. For example, the metal pattern 20 may be heated so that only the transfer material on the first area A1 is evaporated. Selective evaporation of the transfer material will be described later in further detail.

Figure 5:
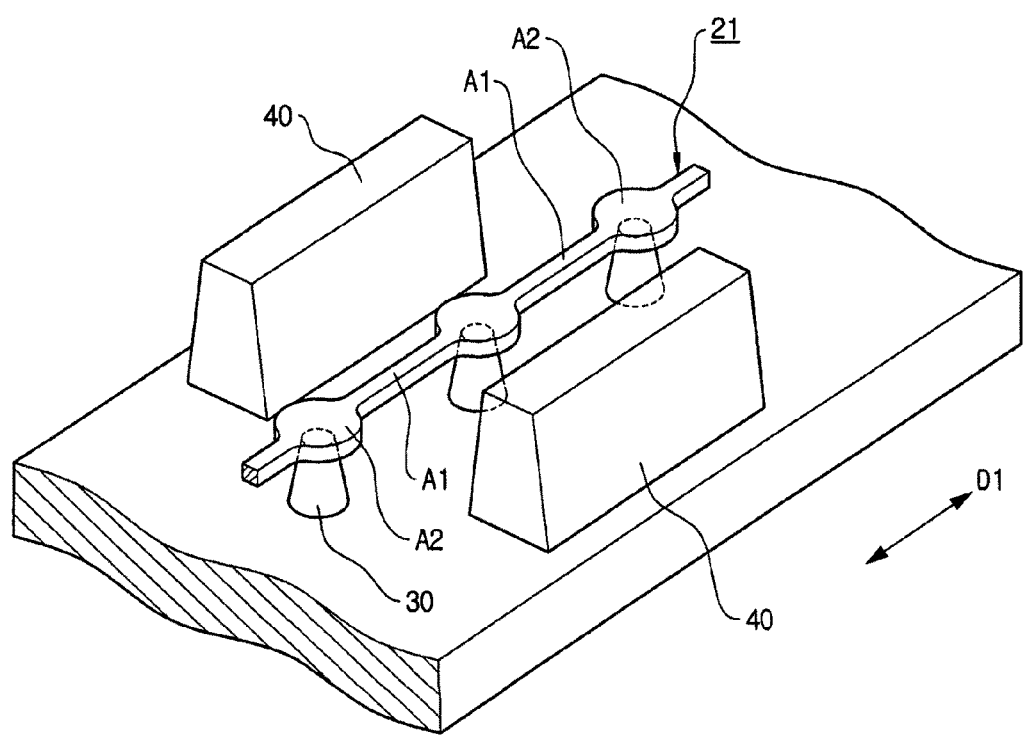
FIG. 5 is a perspective view of another micro-heater according to example embodiments.

FIG. 5 is a perspective view of another micro-heater according to example embodiments. Referring to FIG. 5, the micro-heater may be provided on a substrate 10. The micro-heater may include a metal pattern 21, supports 30, and spacers 40. The metal pattern 21 may have a linear shape extending in one direction D1. The metal pattern 21 may include a plurality of first and second areas A1 and A2, respectively. The first areas A1 of the metal pattern 21 may be straight line segments. The second areas A2 may be enlarged regions positioned between the first areas A1. The support 30 may be connected beneath each of the second areas A2 to fix the metal pattern 21 to the substrate 10.

While the shape of the metal pattern 21 of FIG. 5 may differ from the previous metal pattern 20 of FIGS. 1-4, the configuration and function of the metal pattern 21, the supports 30, and the spacers 40 may be the same as the corresponding features previously described with reference to FIGS. 1 to 4. Therefore, detailed description of the previously-discussed features will be omitted for purposes of brevity.

A metal pattern may have a variety of shapes and may be configured by combining the shapes of the metal patterns shown in FIGS. 1-5. For example, the micro-heater shown in FIG. 5 may optionally include additional areas (not shown) extending from one or more sides of the first areas A1 of the metal pattern 21. Alternatively, a metal pattern may be configured so that a portion of the metal pattern is formed to have the shape of the metal pattern 20 shown in FIG. 1, while another portion of the metal pattern is formed to have the shape of the metal pattern 21 shown in FIG. 5.

The spacers may be formed as block-like structures having a rectangular cross-section. A plurality of spacers may be spaced apart from one another on the substrate 10. However, the spacers 40 shown in FIGS. 1-5 are merely provided for illustrative purposes. For example, the spacer may have a different cross-section (e.g., circular, elliptical) depending on etching conditions. Alternatively, the spacer may be formed as a single linear shape extending along the metal pattern on the substrate 10.

Figure 6:
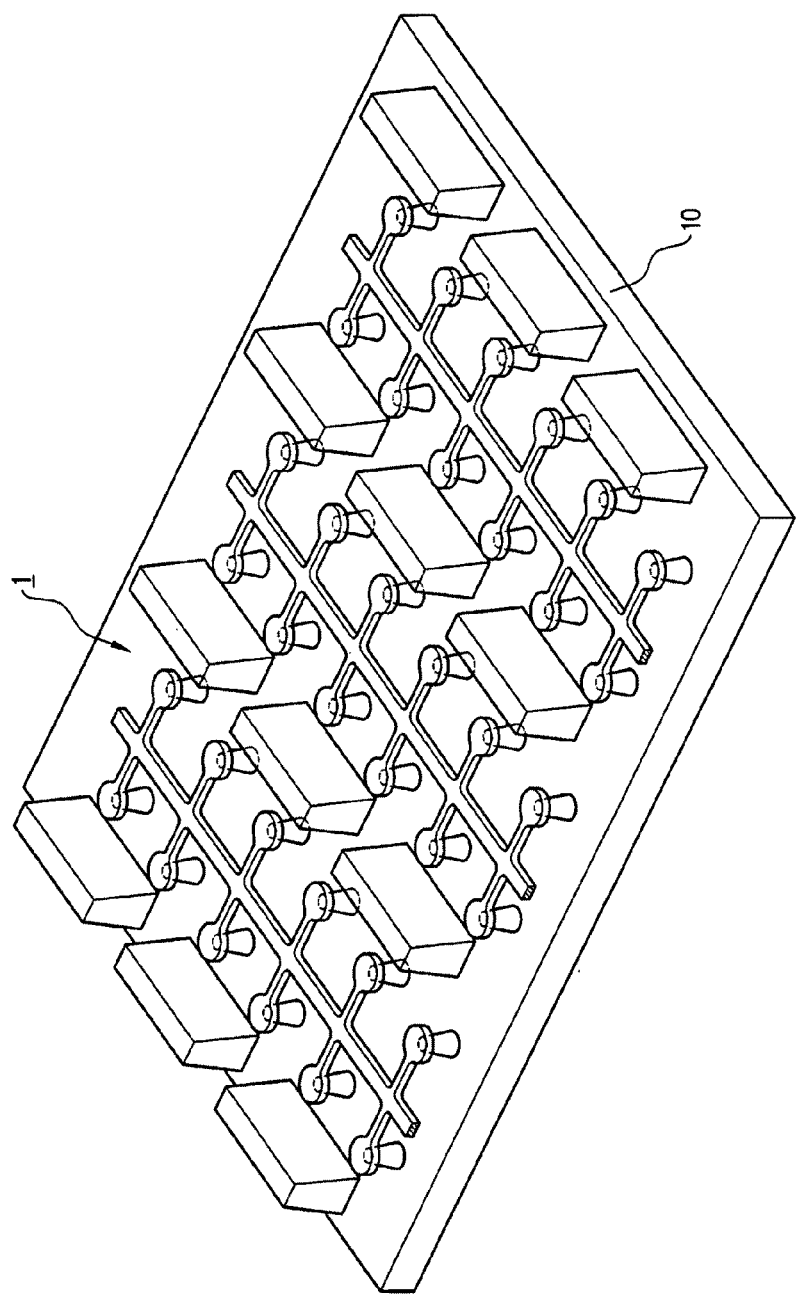
FIG. 6 is a perspective view of a micro-heater array according to example embodiments.

FIG. 6 is a perspective view of a micro-heater array according to example embodiments. Referring to FIG. 6, a plurality of micro-heaters 1 may be arranged in parallel on a substrate 10 to form a micro-heater array. In the micro-heater array, the same power may be applied to the micro-heaters 1 by connecting them in parallel.

The micro-heater 1 or the micro-heater array may be used in various electronic devices which require a relatively high-temperature manufacturing process or a relatively high-temperature operating process. Examples of such electronic devices include a carbon nano-tube transistor, a relatively low-temperature polycrystalline silicon or thin film transistor, and a TE field emission source for a backlight unit.

In an electronic device, the structure of the micro-heater 1 allows the spacing distance between the substrate 10 and another substrate positioned on the substrate 10 to be controlled with the spacers. As a result, minute patterning may be performed.

Although FIG. 6 shows a micro-heater array having micro-heaters according to FIG. 1 connected in parallel, it should be understood that this depiction is merely provided for illustrative purposes. For example, a micro-heater array may be configured using the micro-heater according to FIG. 5 or other micro-heaters according to example embodiments.

Figure 7A:
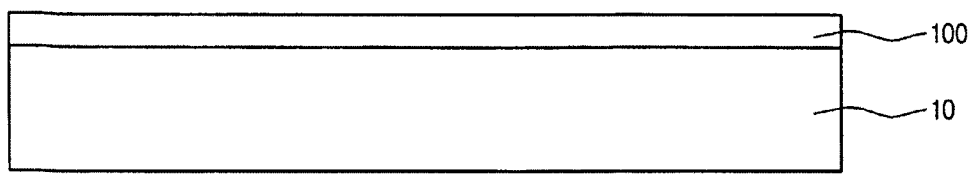
FIGS. 7A through 7F are cross-sectional views of a method for manufacturing a micro-heater according to example embodiments.

FIGS. 7A through 7F are cross-sectional views of a method for manufacturing a micro-heater according to example embodiments. Referring to FIG. 7A, a sacrificial layer 100 may be formed on a substrate 10. The sacrificial layer 100 may include silicon oxide ($SiO_x$) or another suitable oxide. The sacrificial layer 100 and a portion of the substrate 10 may be etched in a subsequent process to form a support. However, it should be understood that the sacrificial layer 100 may be omitted, and the support may be formed by just etching the substrate 10.

Figure 7B:
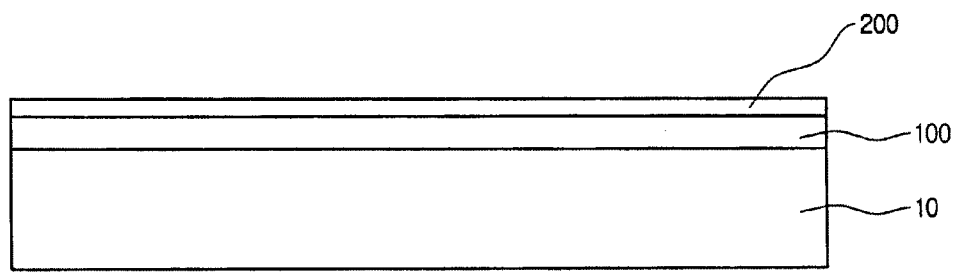

Referring to FIG. 7B, a heating layer 200 may be formed on the sacrificial layer 100. The heating layer 200 may be formed of tungsten, molybdenum, silicon oxide, or another suitable material.

Figure 7C:
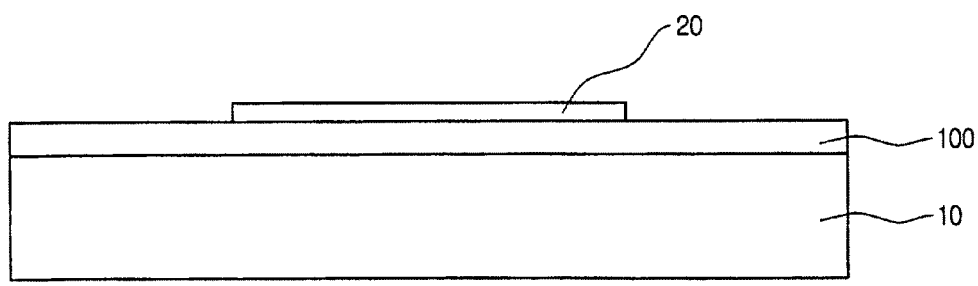

Referring to FIG. 7C, a metal pattern 20 may be formed by patterning the heating layer 200. The heating layer 200 may be patterned into the shapes of the aforementioned metal patterns according to example embodiments. For example, the heating layer 200 may be patterned into the shape of metal pattern 20 and/or metal pattern 21 of FIGS. 1-5.

Figure 7D:
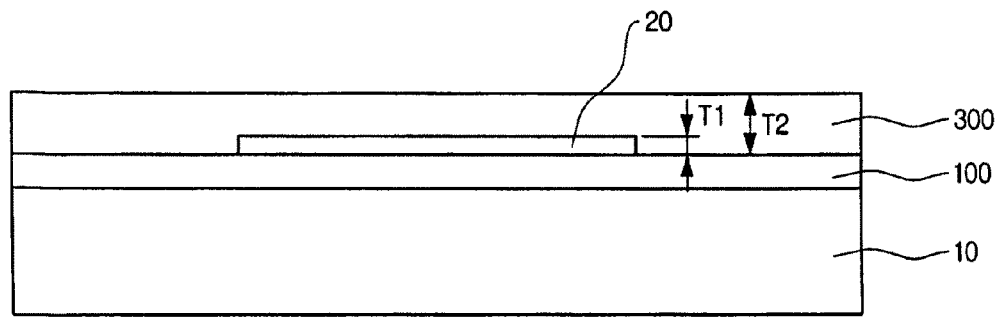

Referring to FIG. 7D, an insulating layer 300 may be formed on the metal pattern 20 and the sacrificial layer 100. The insulating layer 300 may be etched in a subsequent process to form a spacer. The insulating layer 300 may include silicon oxide or another suitable oxide. The thickness T2 of the insulating layer 300 may be greater than the thickness T1 of the metal pattern 20. As a result, the top surface of the resulting spacer may be higher than the top surface of the metal pattern 20.

Figure 7E:
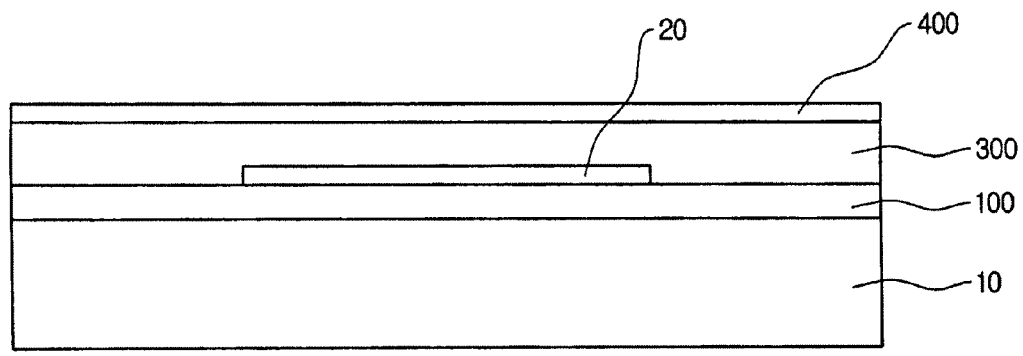

Referring to FIG. 7E, a metal layer 400 may be formed on the insulating layer 300. The metal layer 400 may increase the contact property between the insulating layer 300 and a photoresist layer (not shown) that is formed on the insulating layer 300 for the purpose of etching in a subsequent process. The metal layer 400 may be formed of a metallic material. Alternatively, the metal layer 400 may be omitted, and a photoresist layer may be formed directly on the insulating layer 300 during a subsequent etching process.

Figure 7F:
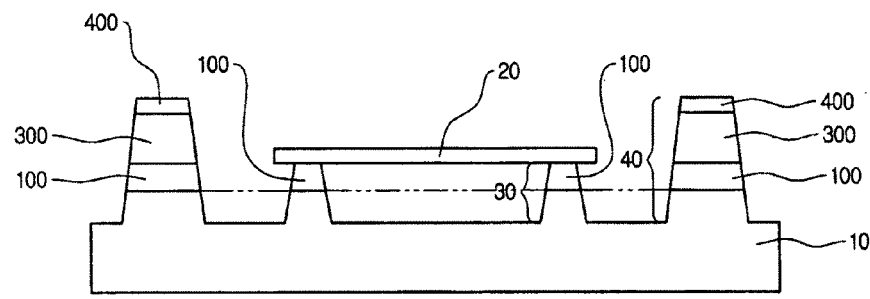

Referring to FIG. 7F, supports 30 and spacers 40 may be formed by etching the metal layer 400, the insulating layer 300, the sacrificial layer 100, and a portion of the substrate 10. Although not shown, the etching process may include forming a photoresist layer on the metal layer 400, performing photo exposure, and etching the exposed layers.

Figure 8A:
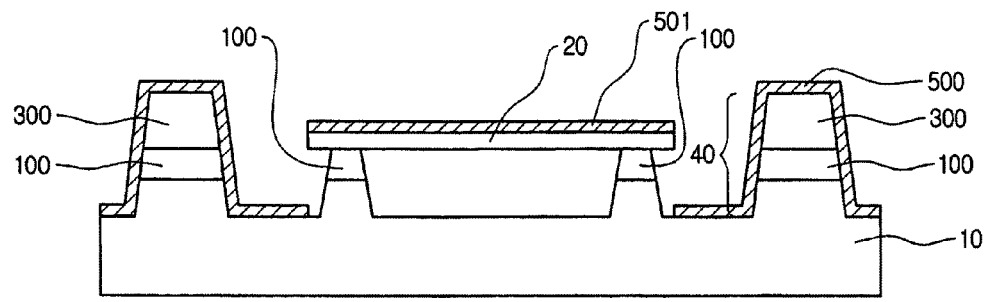
FIGS. 8A through 8C are cross-sectional views of a method for forming a pattern using a micro-heater according to example embodiments.
Figure 8B:
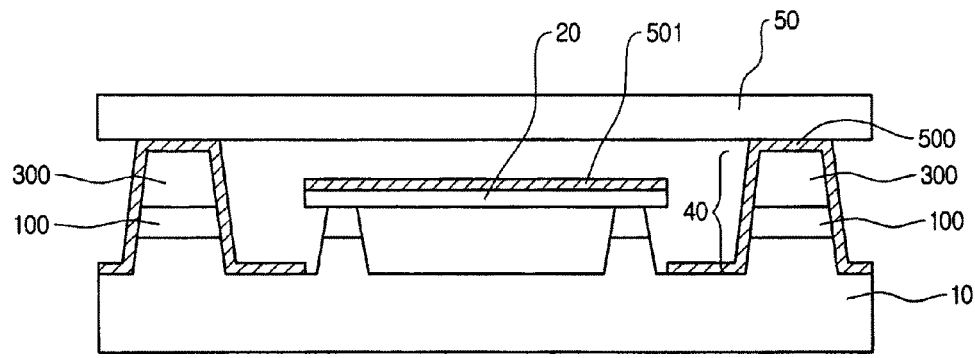
Figure 8C:
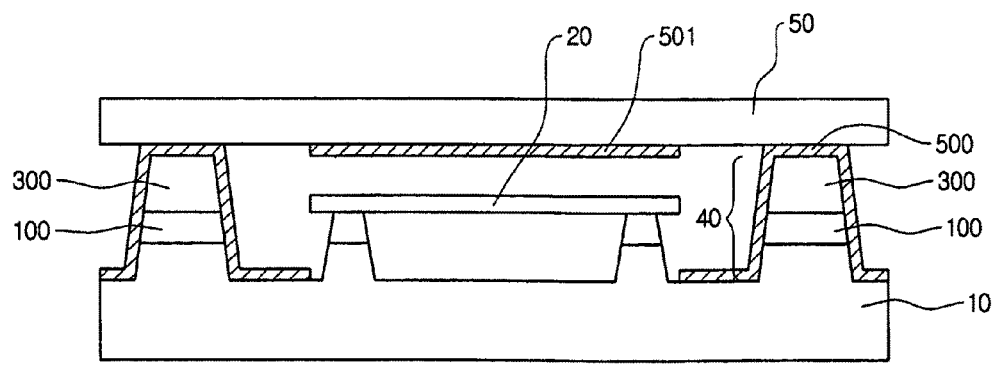

FIGS. 8A through 8C are cross-sectional views of a method for forming a pattern according to example embodiments. The method for forming a pattern may be performed using a micro-heater according to example embodiments.

Referring to FIG. 8A, a substrate 10 having a metal pattern 20 and spacers 40 may be prepared, and transfer materials 500 and 501 may be formed on the substrate 10. The transfer materials 500 and 501 may be organic EL materials or metallic materials. For example, the transfer materials 500 and 501 may include an organic aluminum compound (e.g., tris(8-quinilinolato)-aluminum (Alq3)). Alternatively, the transfer materials 500 and 501 may be relatively low-melting metallic materials having a melting point lower than the heating temperature of the metal pattern 20. For example, the transfer materials 500 and 501 may include copper (Cu) or aluminum (Al).

Referring to FIG. 8B, a target substrate 50 may be placed on the spacers 40 so as to be positioned above the metal pattern 20. The target substrate 50 may be formed with a silicon wafer or glass material. The target substrate 50 may be bonded to the spacers 40. For example, the target substrate 50 may be bonded to the spacers 40 using mechanical pressure or a pressure differential (e.g., lowering the pressure of the space between the substrate 10 and the target substrate 50 to create a vacuum effect). The target substrate 50 may also be bonded to the spacers 40 using other bonding methods known in the art. Alternatively, the target substrate 50 may be spaced apart from the spacers 40 by a predetermined distance.

Referring to FIG. 8C, power may be applied to the metal pattern 20 to heat the metal pattern 20. The metal pattern 20 may be spaced apart from the target substrate 50 by the spacers 40. When the metal pattern 20 is heated to a temperature higher than the melting point of the transfer materials 500 and 501, the transfer material 501 on the metal pattern 20 may be evaporated and transferred onto the target substrate 50. Therefore, a pattern corresponding to the shape of the metal pattern 20 may be formed on the target substrate 50. The method of forming a pattern according to example embodiments may be repeated to form a plurality of patterns on the target substrate 50.

As mentioned above, the metal pattern 20 may be spaced apart from the target substrate 50 by the spacers 40. Additionally, the spacing distance between the metal pattern 20 and the target substrate 50 may be varied by the spacers 40. Thus, the size of the spacers 40 may be adjusted to control the distance that the transfer material 501 travels to the target substrate 50 after being evaporated. Accordingly, it is possible to reduce or prevent the broadening of the line width of the pattern formed on the target substrate 50, and a relatively fine pattern may be achieved.

The transfer material 501 on the metal pattern 20 may be selectively evaporated in an area-specific manner by controlling the power applied to the metal pattern 20. When power is applied to the metal pattern 20 in a square wave form, the transfer material 501 on the metal pattern 20 may be selectively evaporated by controlling the magnitude of the applied power, the power application time, or other related variables.

For instance, referring to FIG. 4, the intensity and duration of the power applied to the metal pattern 20 may be controlled so that only the transfer material formed at the first area A1 of the metal pattern 20 is evaporated, and the transfer material formed at the second and third areas A2 and A3 is not evaporated. In a non-limiting example, where the width W of the first area A1 is about 15 μm, the transfer material on the first area A1 may be selectively evaporated by heating the metal pattern 20 to a temperature of about 350° C. for about 30 seconds.

If power is applied to the metal pattern 20 for a sufficient duration of time, then all the intended transfer material 501 on the metal pattern 20 may be evaporated. However, if the power application time is excessive, then the unintended transfer material 500 on other areas of the substrate 10 (as well as the intended transfer material 501 on the metal pattern 20) may be evaporated as the entire micro-heater is heated. On the other hand, if the power application time is insufficient, then the intended transfer material 501 on the metal pattern 20 may not completely evaporate.

Figure 9:
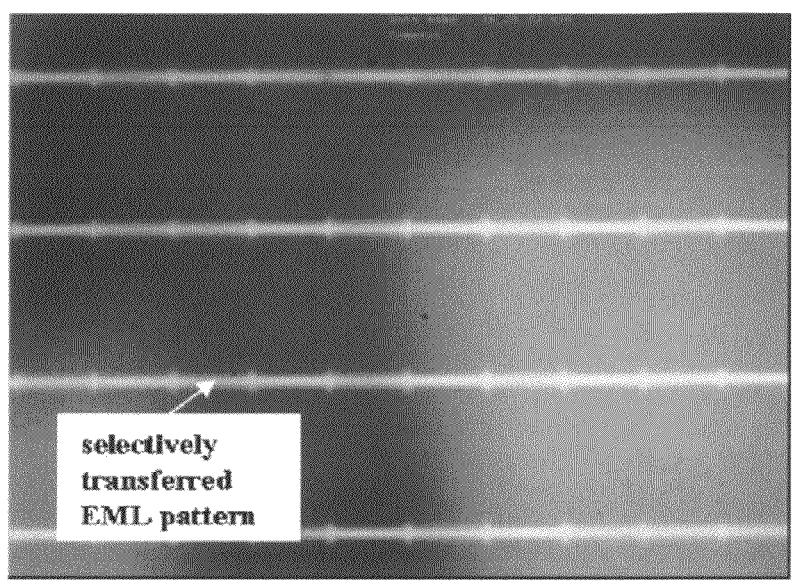
FIG. 9 is a photograph showing patterns formed by a method according to example embodiments.

FIG. 9 is a photograph showing patterns formed by a method according to example embodiments. By controlling the power applied to a metal pattern, a transfer material on the metal pattern may be selectively evaporated and transferred to form a line-shaped, emitting-material layer (EML) pattern on a target substrate. The method according to example embodiments may be repeated to form a plurality of EML patterns on the target substrate.

As mentioned above, power may be applied to the metal pattern in a square wave form. However, it should be understood that this observation is merely provided for illustrative purposes. Thus, power may be applied to the metal pattern in another appropriate wave form (e.g., triangular wave form).

Where the method for forming a pattern according to example embodiments is applied to an active matrix organic light-emitting diode (AMOLED), the method may be used to form patterns of EL materials having different colors, (e.g., red (R), green (G) and blue (B)) on a backplane of a thin film transistor (TFT) substrate. Furthermore, because the micro-heater itself is not damaged or modified in the pattern forming process, a plurality of patterns may be formed on a plurality of target substrates using just one micro-heater.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A micro-heater comprising:
    a metal pattern on a substrate, an uppermost surface of the metal pattern defined by a first plane;
    a support beneath the metal pattern, the support securing the metal pattern to the substrate while spacing the metal pattern apart from the substrate; and
    a spacer on the substrate and adjacent to the metal pattern, an uppermost surface of the spacer defined by a second plane, a first distance from the substrate to the first plane being less than a second distance from the substrate to the second plane.

2. The micro-heater according to claim 1, further comprising:
    a transfer material on the metal pattern, the transfer material evaporating when the metal pattern is heated.

3. The micro-heater according to claim 2, wherein the transfer material includes an electroluminescent material or a metallic material.

4. The micro-heater according to claim 1, further comprising:
    a metal layer on the spacer.

5. The micro-heater according to claim 1, wherein the metal pattern includes one or more of tungsten, molybdenum, and silicon carbide.

6. The micro-heater according to claim 1, wherein the support or the spacer includes one or more of glass and silicon oxide.

7. The micro-heater according to claim 1, further comprising:
    a target substrate on the spacer and above the metal pattern.

8. The micro-heater according to claim 7, wherein the target substrate is spaced apart from the spacer.

9. A micro-heater array having two or more micro-heaters of claim 1 arranged in parallel.

10. A method for manufacturing a micro-heater, comprising:
    forming and patterning a heating layer on a substrate, an uppermost surface of the patterned heating layer defined by a first plane;
    forming an insulating layer on the substrate, the insulating layer being thicker than the patterned heating layer; and
    etching the insulating layer and a portion of the substrate to form a spacer adjacent to the patterned heating layer along with a support positioned between the patterned heating layer and the etched substrate, an uppermost surface of the spacer defined by a second plane, a first distance from the substrate to the first plane being less than a second distance from the substrate to the second plane.

11. The method according to claim 10, further comprising:
    forming a sacrificial layer on the substrate before forming the heating layer,
    wherein forming the spacer and the support includes etching the sacrificial layer.

12. The method according to claim 11, wherein the sacrificial layer includes silicon oxide.

13. The method according to claim 10, further comprising:
    forming a metal layer on the insulating layer, wherein forming the spacer includes etching the metal layer.

14. The method according to claim 10, wherein the heating layer includes one or more of tungsten, molybdenum, and silicon carbide.

15. The method according to claim 10, wherein the insulating layer includes silicon oxide.

16. A method for forming a pattern using the micro-heater according to claim 1, comprising:
   forming a transfer material on the metal pattern;
   placing a target substrate on the spacer and above the metal pattern; and
   applying power to the metal pattern to selectively evaporate and transfer the transfer material from the metal pattern to the target substrate to form the pattern.

17. The method according to claim 16, wherein the target substrate is bonded to the spacer or spaced apart from the spacer.

18. The method according to claim 16, wherein the transfer material includes an electroluminescent material or a metallic material.

19. The method according to claim 16, further comprising:
   repeating the method to form a plurality of patterns on the target substrate.

20. The micro-heater according to claim 1, wherein the metal pattern includes a stem and a plurality of projections extending from the stem.

21. The micro-heater according to claim 20, wherein the plurality of projections are in a form of a plurality of branches.

22. The micro-heater according to claim 20, wherein the support is disposed under at least one of the plurality of projections.

* * * * *